(12) United States Patent
Gebhardt et al.

(10) Patent No.: US 6,208,140 B1
(45) Date of Patent: Mar. 27, 2001

(54) MR TOMOGRAPHY APPARATUS AND METHOD FOR OPERATING SAME TO ALLOW USE OF DIFFERENT GRADIENT FIELD QUALITIES IN THE SAME PULSE SEQUENCE

(76) Inventors: Matthias Gebhardt, Haagstr. 24; Franz Schmitt, Genglerstr. 13, both of 91054 Erlangen (DE)

( * ) Notice: Subject to any disclaimer, the term of this patent is extended or adjusted under 35 U.S.C. 154(b) by 0 days.

(21) Appl. No.: 09/414,553

(22) Filed: Oct. 8, 1999

(30) Foreign Application Priority Data

Nov. 9, 1998 (DE) ................................................ 198 51 583

(51) Int. Cl.⁷ ...................................................... G01V 3/00
(52) U.S. Cl. .......................... 324/309; 324/318; 324/322
(58) Field of Search .................................... 324/309, 318, 324/313, 319, 322

(56) References Cited

U.S. PATENT DOCUMENTS

| | | | |
|---|---|---|---|
| 4,707,658 | 11/1987 | Frahm et al. | 324/309 |
| 4,769,603 | 9/1988 | Oppelt et al. | 324/309 |
| 5,512,858 | 4/1996 | Pausch et al. | 324/318 |
| 5,736,858 | 4/1998 | Katznelson et al. | 324/309 |

FOREIGN PATENT DOCUMENTS 2 314 934   1/1998   (GB) .

*Primary Examiner*—Christine Oda
*Assistant Examiner*—Brij B. Shrivastan

(57) ABSTRACT

In a method for operating a MR-tomography device, and MR-tomography device, the gradient coil system can be switched to different field qualities during a pulse sequence, so that an optimized field quality can be chosen during the individual measuring phases of a pulse sequence.

20 Claims, 3 Drawing Sheets

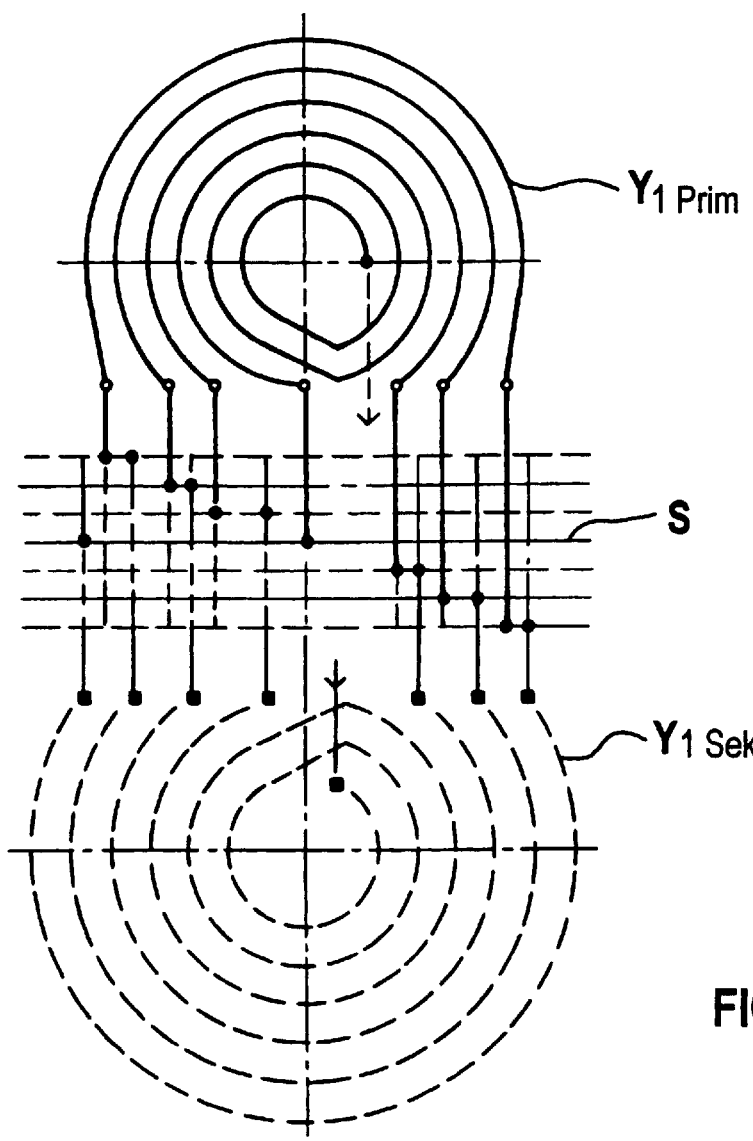
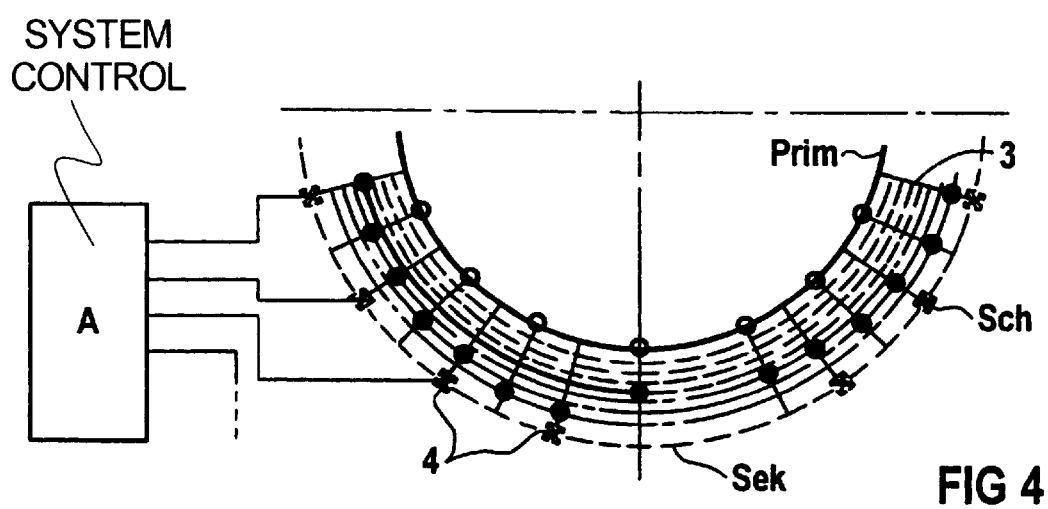

FIG.5

Available Modes with Different Field Qualities for Patient Exam

| Whole-Body Gradient Coils | SpinPrep: FATSAT MAGSAT PRESAT Gradient-Spoiler | Slice Excitation | k-Space Entering | Read-out |
|---|---|---|---|---|
| Fast Sequence | FQ1 | FQ1 | FQ2 | FQ2 |
| Conventional Sequence | FQ1 | FQ1 | FQ1 | FQ1 |
| Shoulder Exam | FQ1 | FQ3 | FQ3 | FQ3 |
| Central Spinal Column | FQ1 | FQ1 | FQ1 | FQ1 |
| Off-center Spinal Column (Cervical or Lumbar) | FQ3 | FQ3 | FQ3 | FQ3 |
| Gradient Sub-Coils | | | | |
| Head Exam with Head Gradient Coil | FQ1 in Whole-Body Coil | FQ4 | FQ4 | FQ4 |

Field Quality

FQ1: Large Linearity Volumes
High Linearity
Medium Gradient Amplitudes
Slow Gradient Switching Times FQ2: Small Linearity Volumes
Low Linearity
High Gradient Amplitudes
Fast Gradient Switching Times FQ3: Off-center Linearity Volumes FQ4: Partial Body FOV (e.g. Head Gradient Coil)

MR TOMOGRAPHY APPARATUS AND METHOD FOR OPERATING SAME TO ALLOW USE OF DIFFERENT GRADIENT FIELD QUALITIES IN THE SAME PULSE SEQUENCE

BACKGROUND OF THE INVENTION

1. Field of the Invention

The present invention is directed to a method for operating a magnetic resonance tomography device and to a magnetic resonance tomography apparatus for implementing the method.

2. Description of the Prior Art

The requirements for a gradient coil are mainly dependent on the pulse sequence that is applied for MR-imaging. In the following, "conventional" pulse sequences are differentiated from "fast" pulse sequences. As used herein, "conventional" pulse sequences can be characterized by only one nuclear magnetic resonance signal being selected per excitation. Examples of conventional pulse sequences are traditional spin echo methods or gradient echo methods for example, but also the faster methods such as FLASH (described in U.S. Pat. No. 4,707,658) and FISP (described in the U.S. Pat. No. 4,769,603) are examples thereof. As used herein, "fast" MR-imaging techniques are those wherein a large number of nuclear magnetic resonance signals are selected subsequent to an excitation. The EPI method (described in the U.S. Pat. No. 4,165,479), in particular, is such a sequence, as well as the turbo spin echo method, the GRASE method and the HASTE methods.

A high image quality and a large measuring volume are particularly important given conventional pulse sequences. The following requirements with respect to the gradient coils thereby result: Large linearity volume ($\approx$5% linearity in the linearity volume of 40–50 cm), moderate gradient intensities (10–20 mT/m) and moderate switching times ($\approx$1 ms).

Great value is particularly placed on the speed in fast pulse sequences, but compromises must be made regarding other parameters. High gradients (20–40 mT/m) must be switched or activated in a very fast manner; this is a specific requirement with respect to the gradient system (switching times approximately 100–500 $\mu$s). Due to the necessary high amplitude change rates of the magnet fields, currents are induced in a patient to be examined, which currents can lead to peripheral muscle stimulations. The stimulation is particularly determined by the maximum field boost. With the given requirements with respect to the gradient intensity and the switching time, the field boost and thus the stimulation risk can only be reduced by reducing the linearity volume of the gradient coil.

To that end, it is known from the German OS 195 40 746 to use a modular gradient coil system. A central modular coil alone is utilized for fast pulse sequences. This central modular coil exhibits only a relatively small linearity volume. Since the efficiency of a coil is approximately proportional to the volume, high gradient intensities and short rise times can be realized with such a coil. Although the measuring volume is limited, fast pulse sequences can be realized, the field boost remains limited. Given operation of the MR-tomography device with conventional sequences, correcting coils are connected to the central part of the coil, these correcting coils increasing the linearity volume; however, this is at the expense of the gradient performance.

Only prior to the measurement, the user has the choice to either optimize the gradient coil system for maximal gradient intensity/gradient rise speed or to optimize it for a maximal linearity volume given this modular gradient coil system.

SUMMARY OF THE INVENTION

An object of the present invention is to provide a method for the operation of an MR-tomography device, and an MR-tomography device, that can be utilized more universally.

The above object is achieved in accordance with the principles of the present invention in a magnetic resonance tomography apparatus, and a method for operating such a magnetic resonance tomography apparatus, wherein a gradient coil system of the apparatus can be switched to different field qualities during a pulse sequence forming a single scanning/data acquisition sequence having measuring phases including spin preparation, slice excitation, k-space filling and readout, with a field quality being employed in one of these measuring phases which is different from the field qualities employed in the other measuring phases.

The switchability of the gradient coil system in different measuring phases during the measuring process allows the field quality that is optimal for the respective measuring phase to be used. This is based on the knowledge that, given a number of pulse sequences, the competing requirements of gradient intensity/gradient rise rate and linearity volume are different during the sequence process. Given the "fast" pulse sequences defined above, the gradient intensity and the gradient rise times are also critical mainly in the readout phase. In the portion of the sequence wherein spin preparation and the slice excitation take place, the good linearity is more important. This can be taken into consideration by the switchability of the field quality regarding these parameters during the sequence process.

Here, the switchability of the field quality is not limited to the factors of linearity and gradient rise time/gradient intensity, but must be viewed more broadly. A field quality, for example, which is optimized to an off-center linearity volume can be effective in an embodiment. Such an optimization is advantageous for measurements in the shoulder area for example, since the measurement must hereby ensue outside of the magnet center.

Given saturation pulses with which the spin magnetization is saturated in a volume outside of the measuring volume, the gradient linearity is typically more important than the gradient intensity/gradient rise rate, so that the field quality can be correspondingly optimized.

DESCRIPTION OF THE DRAWINGS

FIG. 3 schematically shows the structure of a segment of a gradient coil.

FIG. 4 shows connections between the terminals of primary part and secondary part of a gradient coil segment, FIG. 5 is a table for different types of examinations dependent on the respectively required field quality of the gradient field.

DESCRIPTION OF THE PREFERRED EMBODIMENTS

The invention is subsequently explained on the basis of the EPI method, as disclosed in the U.S. Pat. No. 4,165,479, cited above. The EPI method, however, is an only example of a large number of pulse sequences, which can be advantageously realized with the method described below.

Figure 1:
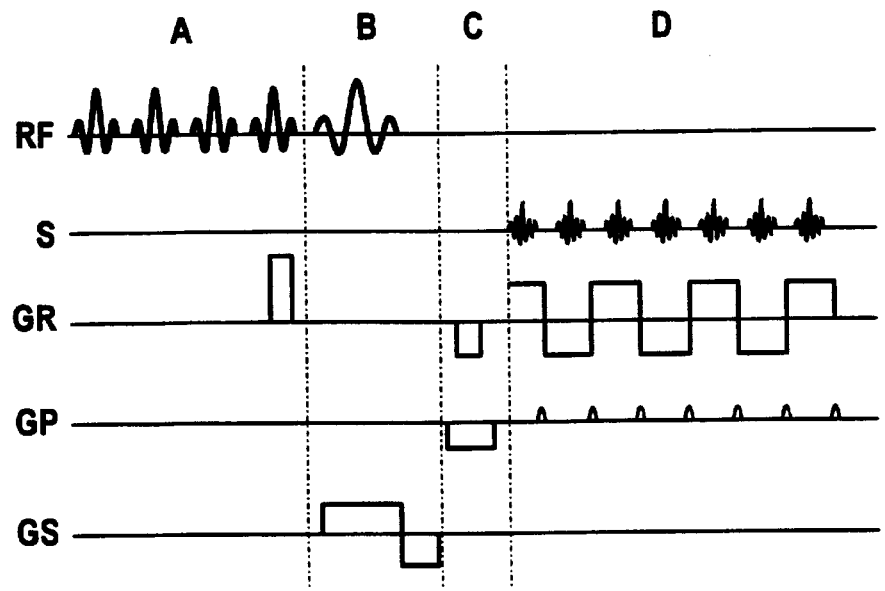
FIG. 1 shows an exemplary embodiment for a pulse sequence usable with the inventive method and apparatus.

Depending on the type of examination, a preparation phase A precedes the actual measuring sequence; the spin magnetization is prepared in this preparation phase A. A saturation of the magnetization of specific spins can ensue for example, but these spins do not emit a signal given the subsequent measurement. The saturation can be spectrally-selective or spatially selective for example. Conventional applications are the pre-saturation of specific slices or the saturation of fat portions, for example. This preparation phase is not time-critical, so that the field quality can also be optimized to large linearity volume, or to a high linearity of the gradient field given fast sequences. As shown in FIG. 1, the saturation ensues by a succession of high-frequency pulses RF for example, and the phase coherence is destroyed by a strong gradient Gx.

A slice-selective excitation typically ensues in the subsequent measuring phase B by a high-frequency pulse RF under the influence of a slice readout gradient GS. This measuring phase B of the slice excitation is not time-critical either, so that a large linearity volume, or high linearity of the gradient given the EPI sequence also can be achieved.

The subsequent measuring phase C can be generally described as a k-space positioning (filling). In the case of the EPI sequence, a pre-phasing in the readout direction ensues, for example, by a negative gradient GR, so that the following signal starts with the maximum negative k-space position in the readout direction. Further, the k-space trajectory in the phase-coding direction is also started with the maximum negative value by a negative pulse of the gradient GP in the phase-coding direction. Given fast sequences, speed is more important in this measuring phase C than linearity, so that the field quality applied here is expediently optimized to high gradient amplitudes and short switching times.

In the following measuring phase D of the readout, a large number of nuclear magnetic resonance signals is acquired under activated readout gradients given fast pulse sequences. In the extreme case, the entire k-space can thereby be scanned without further excitation. High gradient amplitudes and short switching times are particularly important, so that these criteria are determining for the determination of the field quality. The readout gradient GR continuously changes its sign in the EPI method, so that new nuclear resonance signals S are continuously generated. Small gradient pulses (referred to as "blips") of the phase-coding gradient GP are activated during the change of sign, so that the k-space position in phase encoding direction is advanced by one step from signal-to-signal.

As the field quality which is changed during the sequence, not only the linearity volume, or gradient amplitudes and switching times, can be used but also other arbitrary field qualities. An off-center linearity volume is a further example. It is known that gradient coils can be fashioned such that the linearity volume is not in the coil center. This is expedient, for example, when MR images of the shoulder are made, since these cannot be centrally seated due to the limited expanse of the patient tube. This is also true for images of the cervical spine or lumbar spine, for example.

The invention is also usable in connection with gradient sub-coils that do not include the entire homogeneity volume of the magnet, but only include the head of the patient, for example.

Therefore, the conventional whole body gradient coil can be utilized for the excitation or saturation of the spin magnetization, for example, and a gradient sub-coil, a specific head gradient coil, for example, can be utilized in the readout phase of the nuclear magnetic resonance signals.

Different examination types with a whole body gradient coil, or a gradient sub-coil together with the required field quality of the gradient field are shown in the table according to FIG. 5. From this table, one can see that there are situations (conventional imaging for example) wherein it is expedient to operate throughout with a field quality (referred to as FQ1 in the table) that is characterized by a large linearity volume, high linearity, medium gradient amplitude and slow gradient switching times. However, for fast imaging, this field quality is only optimal for the measuring phases of the spin preparation and the slice excitation. In contrast thereto, the field quality referred to as FQ2 is necessary for the subsequent measuring phases of the k-space positioning and the readout. This field quality FQ2 is characterized by high gradient amplitudes, short gradient switching times, small linearity volume and low linearity.

The invention is not limited to the switching between two field qualities, there can be intermediate stages between the field quality maximum linearity volume/high linearity/maximal linearity and the field quality high gradient amplitudes/short gradient switching times for example.

The switching between more than two field qualities is achieved by cutting-in additional coils according to the prior art, requires more degrees of freedom for the switchability of the gradient coils than are available in this prior art approach. A solution in accordance with the invention is shown in the FIGS. 2 through 4.

Figure 2:
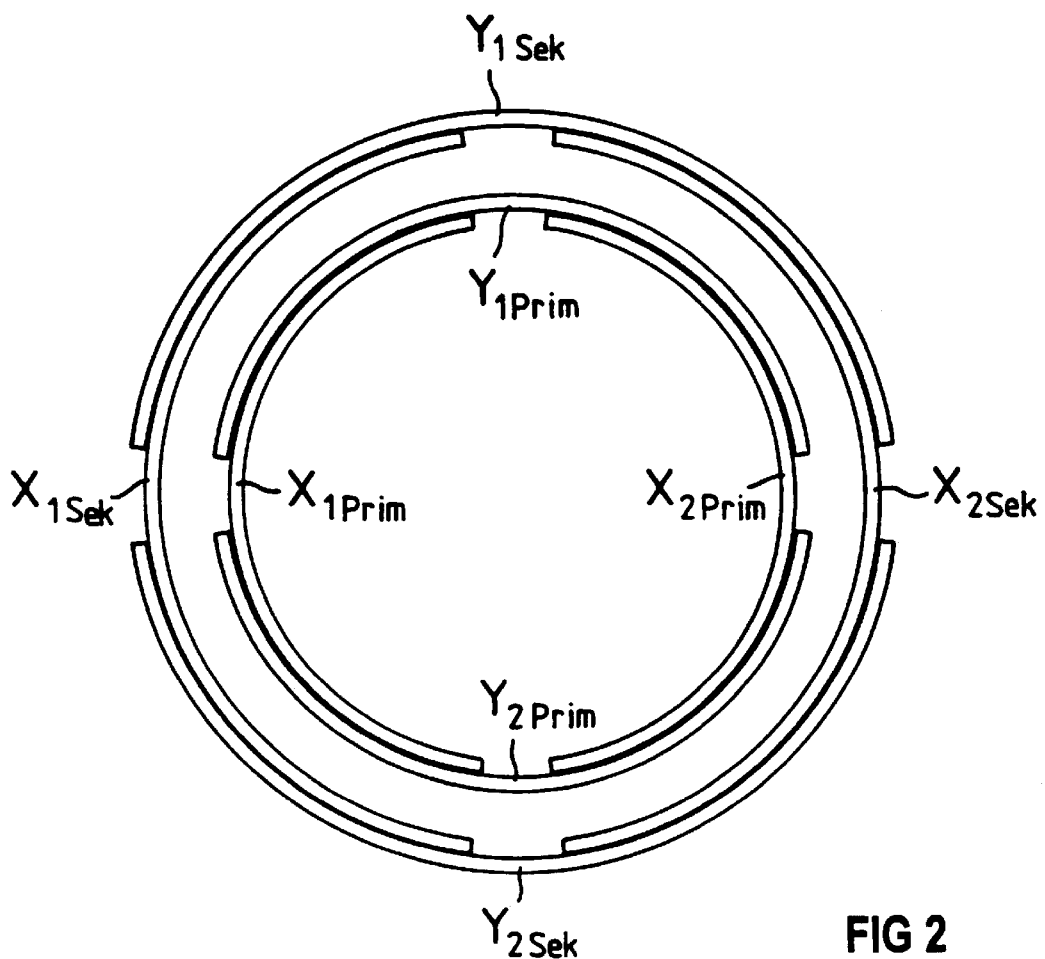
FIG. 2 schematically shows a cross section through a gradient tube, with only the gradient coils for the x-direction and the y-direction being shown.

FIG. 2 schematically shows the structure of a gradient tube in which four coils are provided for each gradient x, y, z, these coils being attached in the gradient tube in a saddle shaped fashion. For clarity, only the gradient coils for the x-gradients and y-gradients are shown. Given the actively shielded gradient coils that currently are multiply used, each coil, in turn, is formed by primary layers and secondary layers. In the sectional illustration according to FIG. 2, two sub-coils $x_1$, $x_2$, $y_1$, $y_2$, $z_1$, $z_2$, respectively with a primary layer Prim of the windings and/or secondary layer Sek of the windings, for each gradient can be seen. Given conventional coils, the primary layer and the secondary layer are connected in series via only one connection. A gradient coil design that is switchable with many degrees of freedom is achieved by omitting one part or all return conductors of the primary layers and secondary layers that are situated at the ends of the gradient tube. Instead of the return conductors, direct connections between primary layer and secondary layer are provided.

FIG. 3 shows the primary layer and the secondary layer of a coil in an unfolded state and in an unrolled state. The section referred to as S corresponds with the end face of the coil body. Terminals for the coil conductors are brought out on this section and connections are produced between primary layer Prim and secondary layer Sek. These connections are variable according to the above explained requirements regarding the field quality, i.e. they are switchable during the progression of the pulse sequence.

FIG. 4 schematically shows the actual geometrical arrangement of the section S at the face side of the gradient tube. Switch elements Sch are provided at an appropriate location for the variable connection of the conductors of primary layer Prim and secondary layer Sek. These switch elements Sch are preferably fashioned as semiconductor switch due to the required switching speeds. These semiconductor switches Sch are driven corresponding to the required field quality by a system control A that controls the pulse sequence. Therewith, the optimal field quality during the progression of a measuring sequence can be provided.

General design methods, as described in U.S. Pat. No. 5,309,107 for example, can be used for the optimization of the gradient coils with respect to different field qualities.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance tomography device comprising the steps of:
   providing a gradient coil system which can be switched to produce different field qualities;
   conducting a measuring sequence comprising a plurality of measuring phases including spin preparation, slice excitation, k-space filling and readout; and
   switching said gradient coil system during said measurement sequence to produce a field quality in at least one of said measuring phases which is different from respective field qualities in others of said measuring phases in said measuring sequence.

2. A method as claimed in claim 1 comprising switching said gradient coil system to produce a field quantity to achieve maximum linearity of a gradient field in said at least one of said measuring phases.

3. A method as claimed in claim 1 comprising switching said gradient coil system to produce a field quality which is optimized for short gradient switching times in said at least one of said measuring phases.

4. A method as claimed in claim 1 comprising switching said gradient coil system to produce a field quality that is optimized for high gradient field amplitudes in said at least one of said measuring phases.

5. A method as claimed in claim 1 comprising switching said gradient coil system to produce a field quality that is optimized for an off-center linearity volume in said at least one of said measuring phases.

6. A method as claimed in claim 1 comprising switching said gradient coil system to produce a field quantity for a large homogeneity volume in said slice excitation measuring phase.

7. A method as claimed in claim 1 comprising, in said spin preparation phase, saturating spin magnetization in a subject, and comprising switching said gradient coil system to produce a field quality in said spin preparation measuring phase for maximizing linearity of a gradient field.

8. A method as claimed in claim 1 comprising switching said gradient coil system to produce a field quality that is optimized for a high gradient amplitude in said readout measuring phase.

9. A method as claimed in claim 1 comprising switching said gradient coil system to produce a field quality that is optimized for maximum linearity of a gradient field in said readout measuring phase.

10. A method as claimed in claim 1 comprising employing a whole-body gradient coil in at least one of said plurality of measuring phases and employing a gradient sub-coil in at least one other of said plurality of measuring phases.

11. A magnetic resonance tomography device comprising:
    a gradient coil system operable to produce different field qualities;
    an MR scanning arrangement including said gradient coil system, for conducting a measuring sequence comprising a plurality of measuring phases including spin preparation, slice excitation, k-space filling and readout; and
    means for switching said gradient coil system during said measurement sequence to produce a field quality in at least one of said measuring phases which is different from respective field qualities in others of said measuring phases in said measuring sequence.

12. A device as claimed in claim 11 wherein said means for switching comprises means for switching said gradient coil system to produce a field quantity to achieve maximum linearity of a gradient field in said at least one of said measuring phases.

13. A device as claimed in claim 11 wherein said means for switching comprises means for switching said gradient coil system to produce a field quality which is optimized for short gradient switching times in said at least one of said measuring phases.

14. A device as claimed in claim 11 wherein said means for switching comprises means for switching said gradient coil system to produce a field quality that is optimized for high gradient field amplitudes in said at least one of said measuring phases.

15. A device as claimed in claim 11 wherein said means for switching comprises means for switching said gradient coil system to produce a field quality that is optimized for an off-center linearity volume in said at least one of said measuring phases.

16. A device as claimed in claim 11 wherein said means for switching comprises means for switching said gradient coil system to produce a field quantity for a large homogeneity volume in said slice excitation measuring phase.

17. A device as claimed in claim 11 wherein said MR scanning arrangement in said spin preparation phase, saturates spin magnetization in a subject, and 11 wherein said means for switching comprises means for switching said gradient coil system to produce a field quality in said spin preparation measuring phase for maximizing linearity of a gradient field.

18. A device as claimed in claim 11 wherein said means for switching comprises means for switching said gradient coil system to produce a field quality that is optimized for a high gradient amplitude in said readout measuring phase.

19. A device as claimed in claim 11 wherein said means for switching comprises means for switching said gradient coil system to produce a field quality that is optimized for maximum linearity of a gradient field in said readout measuring phase.

20. A device as claimed in claim 11 wherein said gradient coil system includes a whole body gradient coil and a gradient sub-coil and wherein said MR scanning arrangement activates said whole-body gradient coil in at least one of said plurality of measuring phases and activates said gradient sub-coil in at least one other of said plurality of measuring phases.

* * * * *